United States Patent
Ohmi et al.

(10) Patent No.: US 7,928,018 B2
(45) Date of Patent: Apr. 19, 2011

(54) PLASMA PROCESSING METHOD AND METHOD FOR MANUFACTURING AN ELECTRONIC DEVICE

(75) Inventors: Tadahiro Ohmi, Miyagi (JP); Akinobu Teramoto, Miyagi (JP); Hiroshi Yamauchi, Miyagi (JP); Yukio Hayakawa, Miyagi (JP)

(73) Assignee: Foundation for Advancement of International Science, Tsukuba-shi, Ibaraki (JP)

(*) Notice: Subject to any disclaimer, the term of this patent is extended or adjusted under 35 U.S.C. 154(b) by 545 days.

(21) Appl. No.: 10/594,895

(22) PCT Filed: Mar. 31, 2005

(86) PCT No.: PCT/JP2005/006259
§ 371 (c)(1),
(2), (4) Date: Nov. 7, 2006

(87) PCT Pub. No.: WO2005/096363
PCT Pub. Date: Oct. 13, 2005

(65) Prior Publication Data
US 2008/0268657 A1    Oct. 30, 2008

(30) Foreign Application Priority Data
Mar. 31, 2004 (JP) .................. 2004-104237

(51) Int. Cl.
*H01L 21/31* (2006.01)
*H01L 21/469* (2006.01)
*H01L 21/02* (2006.01)
*C23C 16/00* (2006.01)

(52) U.S. Cl. ........ 438/769; 438/765; 438/771; 438/772; 438/775; 438/776; 438/777; 257/411; 118/723 MW; 118/723 R

(58) Field of Classification Search .................. None
See application file for complete search history.

(56) References Cited

U.S. PATENT DOCUMENTS
6,830,652 B1 * 12/2004 Ohmi et al. ............. 156/345.41
2004/0245584 A1 * 12/2004 Murakawa et al. ........... 257/411

FOREIGN PATENT DOCUMENTS
| JP | 2001-500327 A | 1/2000 |
| JP | 2000-294550 A | 10/2000 |
| JP | 2003-068731 A | 3/2003 |
| JP | 2003-183839 A | 7/2003 |

* cited by examiner

*Primary Examiner* — Andy Huynh
*Assistant Examiner* — Valerie Brown
(74) *Attorney, Agent, or Firm* — Foley & Lardner LLP

(57) ABSTRACT

The application of oxynitriding treatment to electronic appliances involve the problem that $N_2$ ions are formed to thereby damage any oxynitride film. It is intended to provide a method of plasma treatment capable of realizing high-quality oxynitriding and to provide a process for producing an electronic appliance in which use is made of the method of plasma treatment. There is provided a method of plasma treatment, comprising generating plasma with a gas for plasma excitation and introducing a treating gas in the plasma to thereby treat a treatment subject, wherein the treating gas contains nitrous oxide gas, this nitrous oxide gas introduced in a plasma of <2.24 eV electron temperature, so that the generation of ions tending to damage any insulating film is reduced to thereby realize high-quality oxynitriding. Further, there is provided a process for producing an electronic appliance in which use is made of the method of plasma treatment.

4 Claims, 11 Drawing Sheets

[FIG. 1]
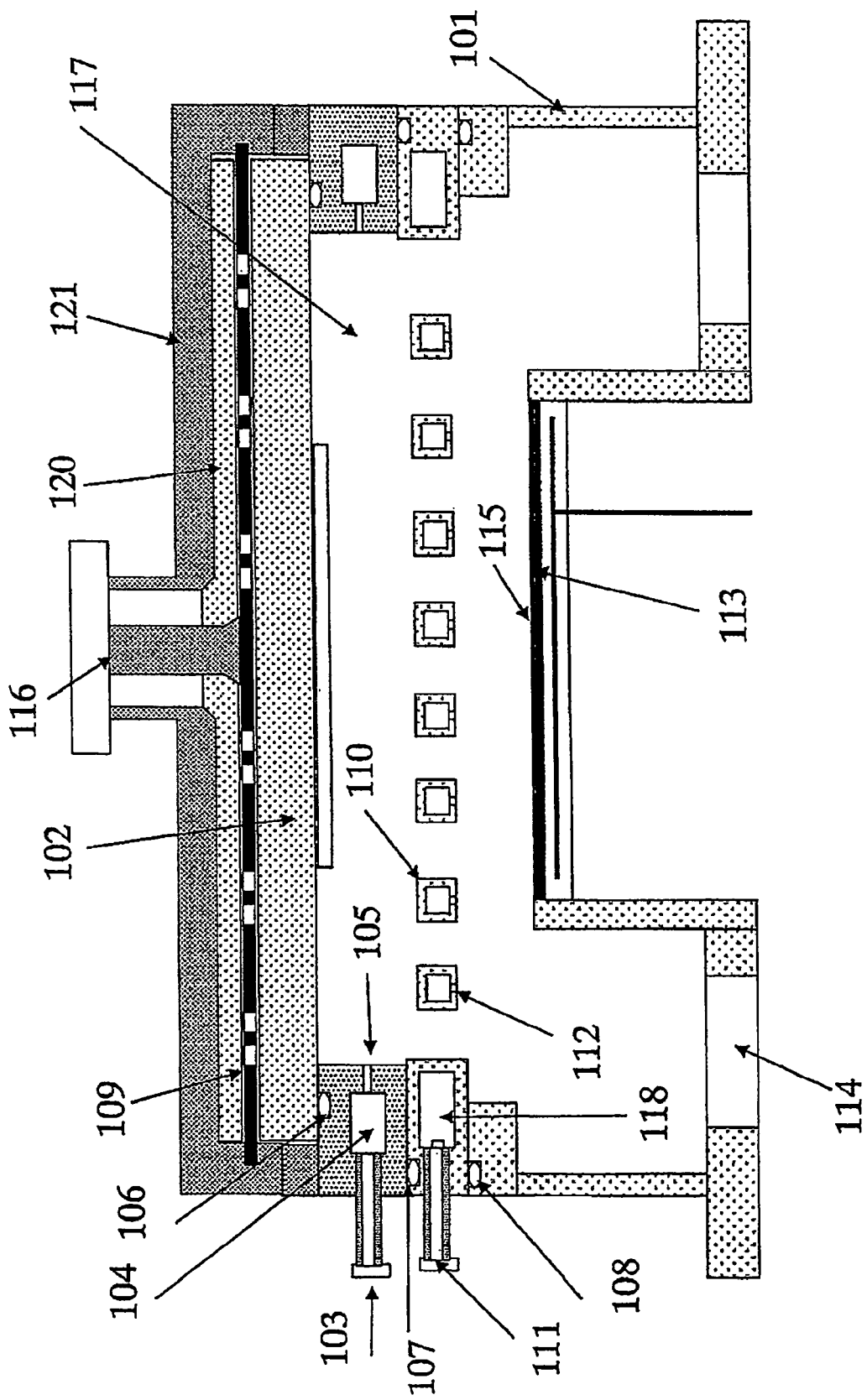

[FIG. 2]
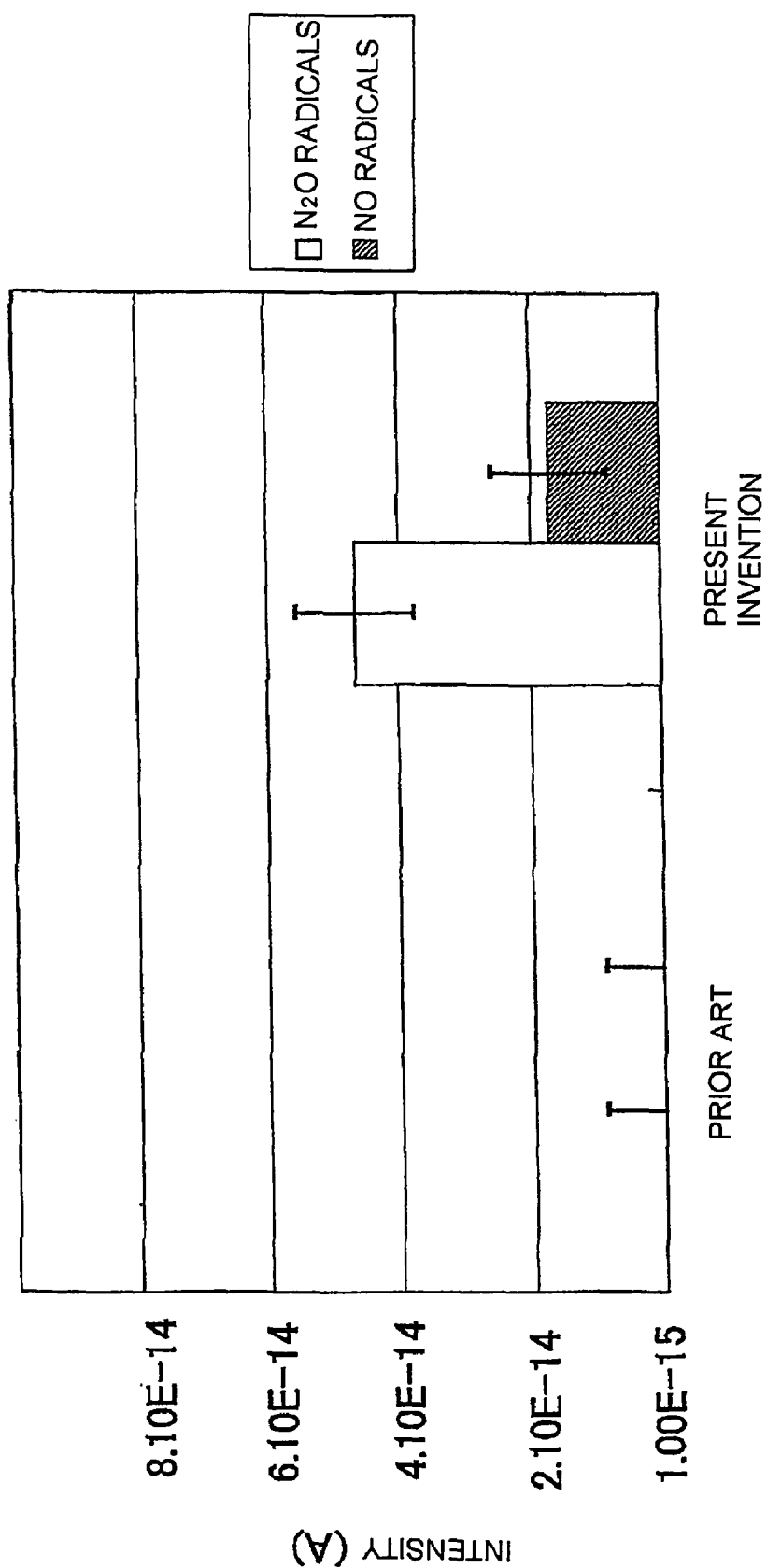

[FIG. 3]
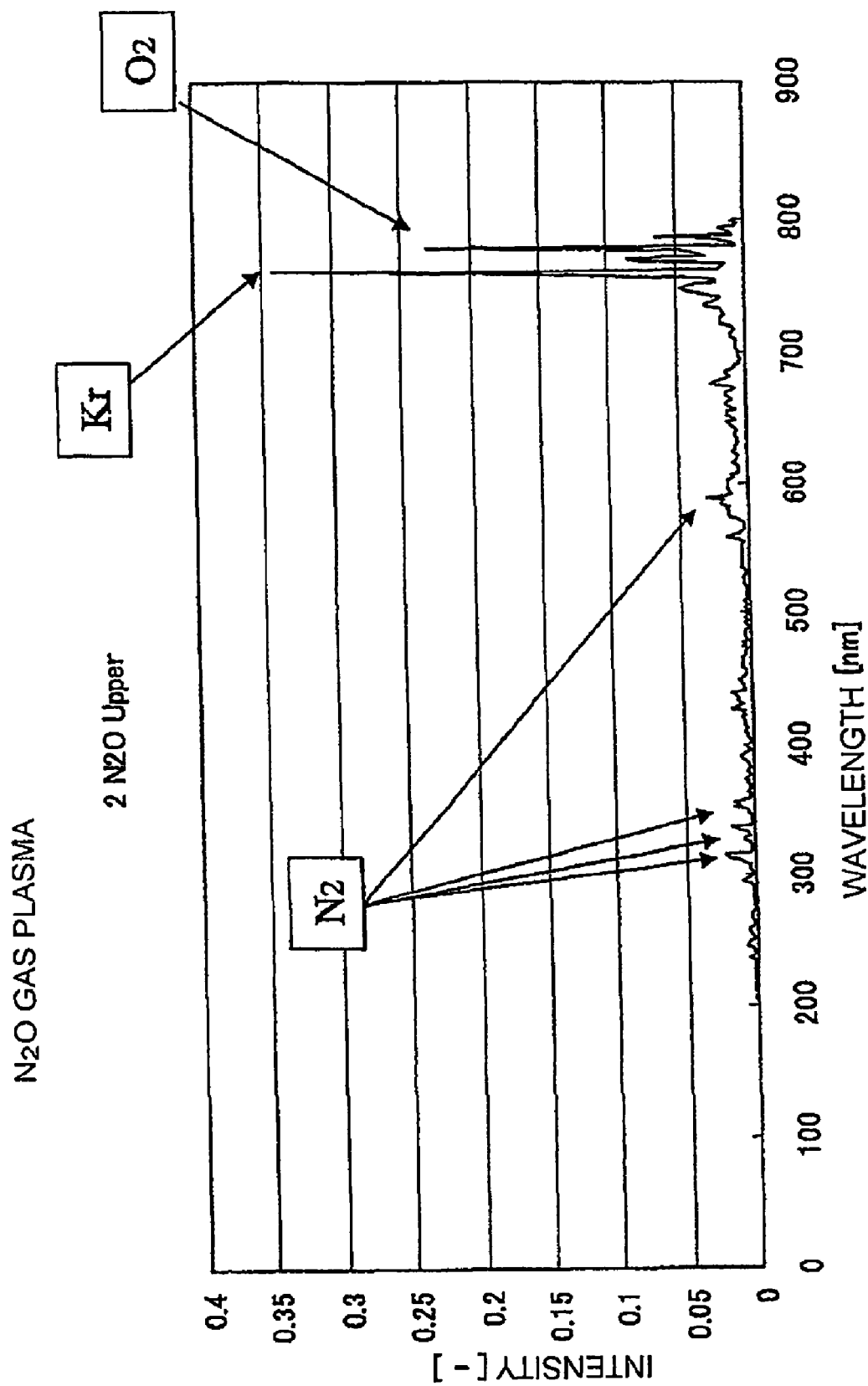

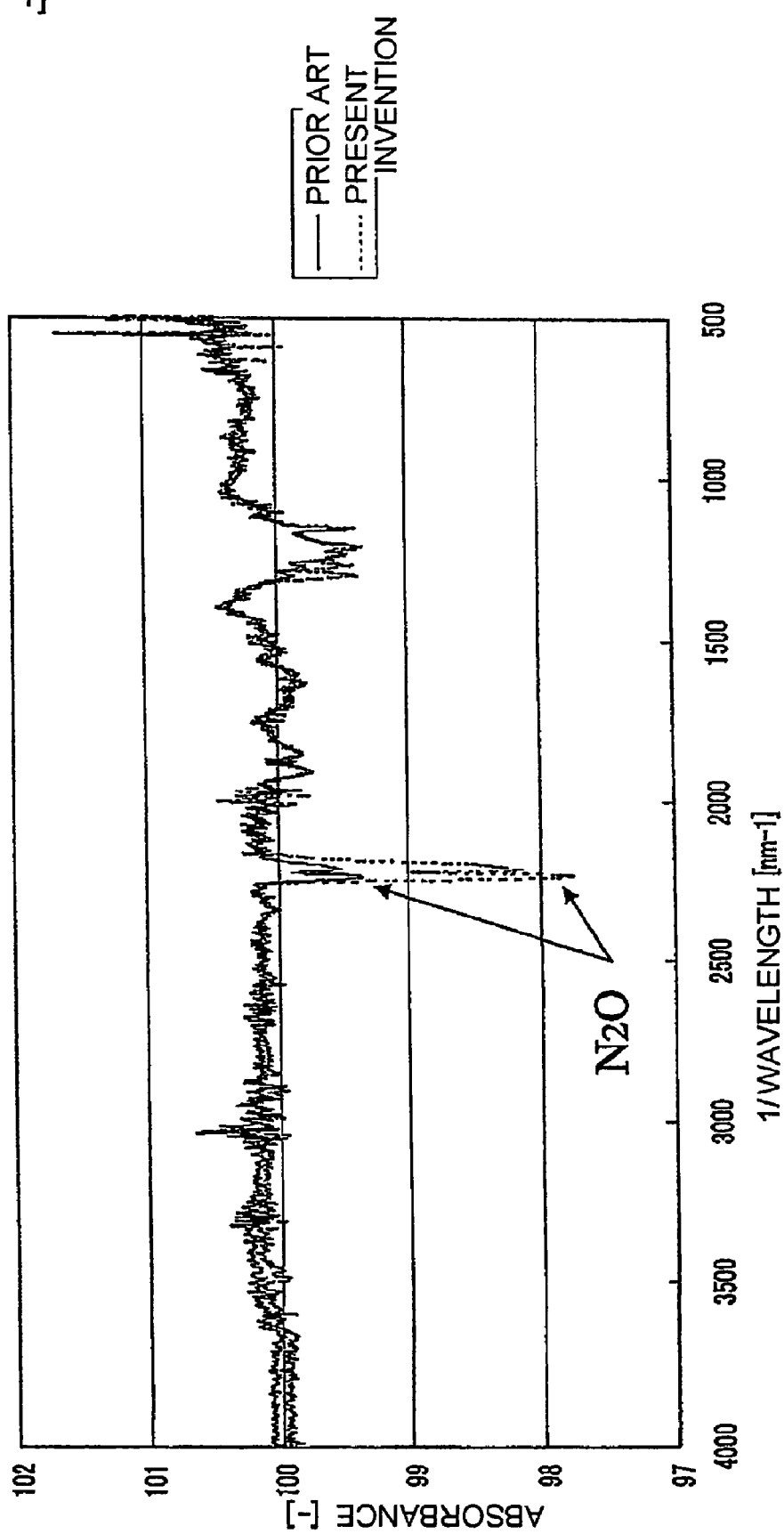
[FIG. 4]

[FIG. 5]
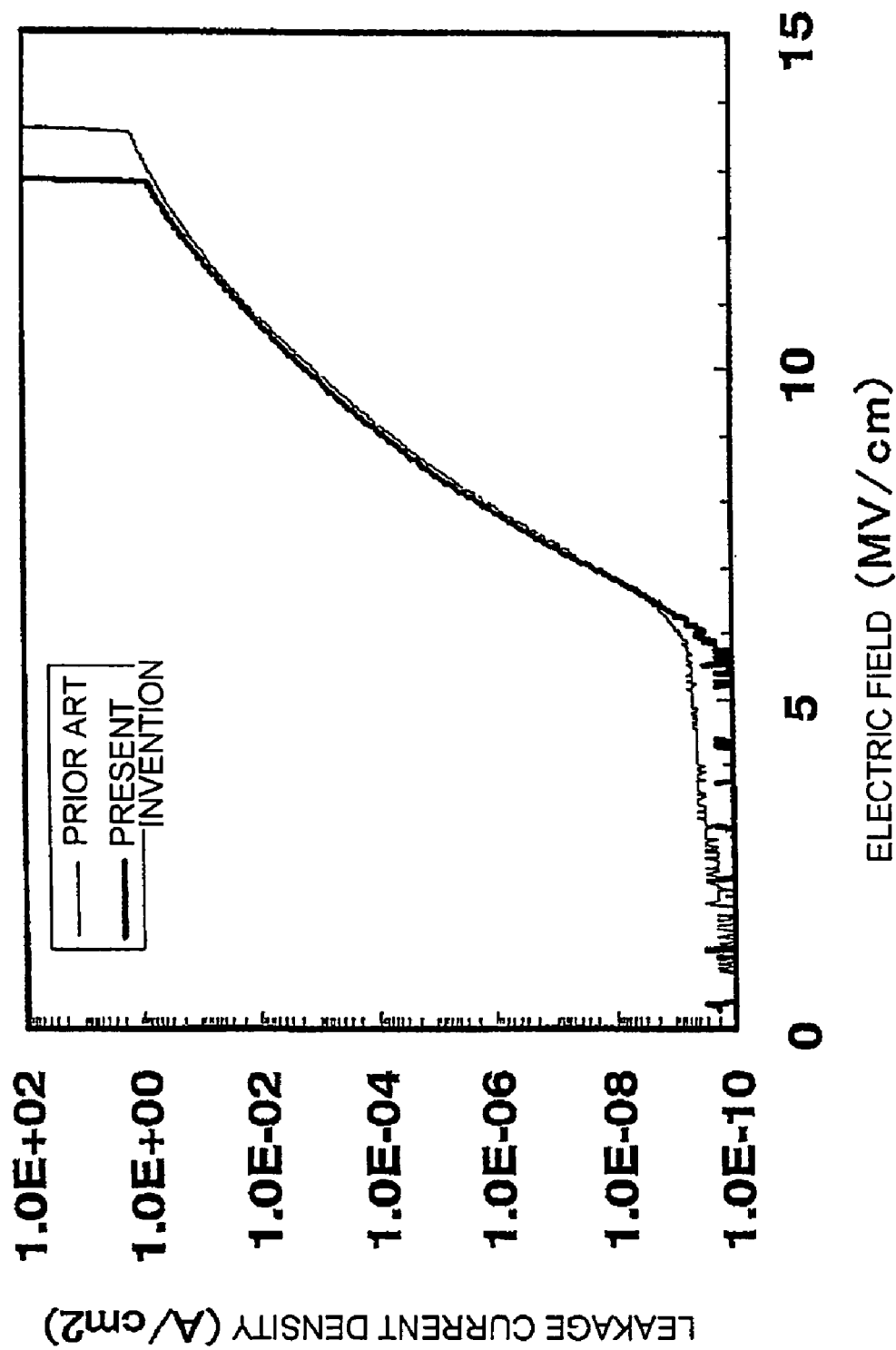

[FIG. 6]
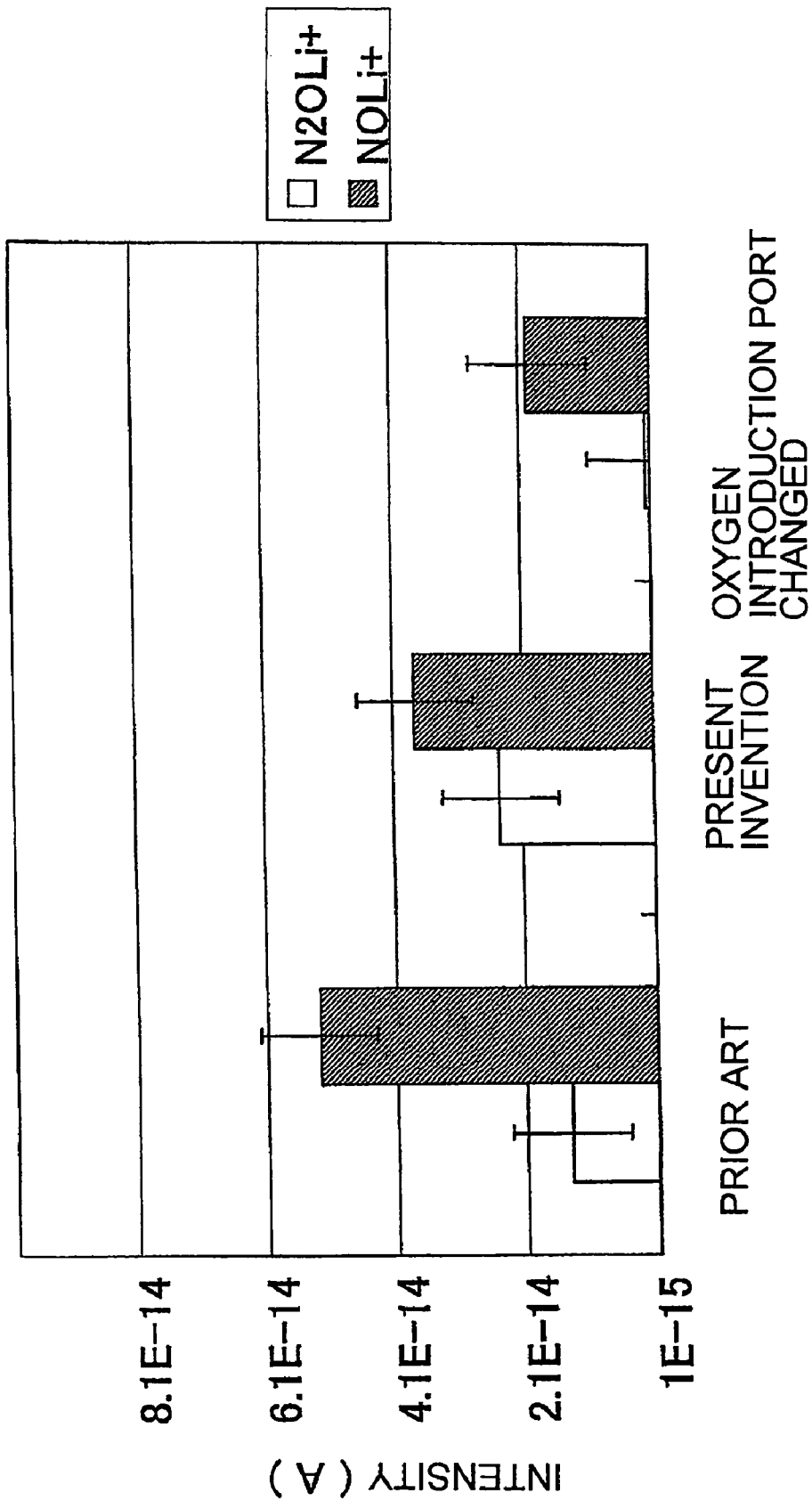

[FIG. 7]
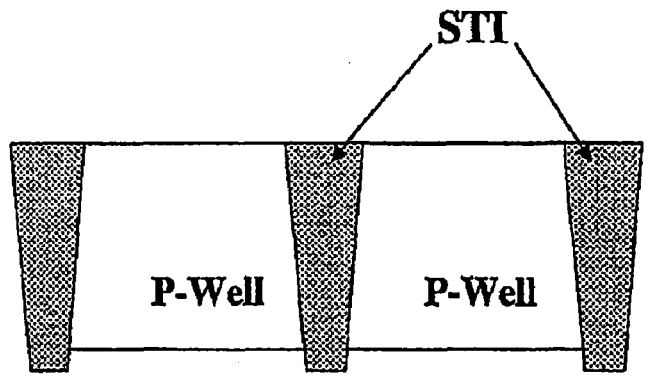
[FIG. 8]
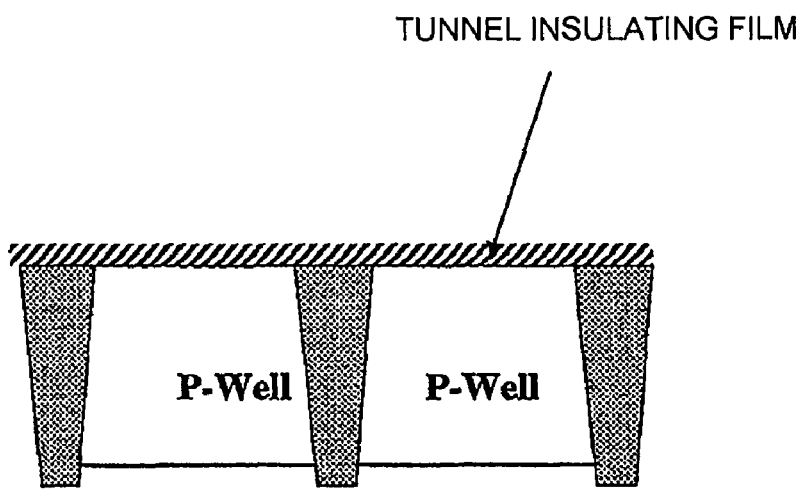
[FIG. 9]
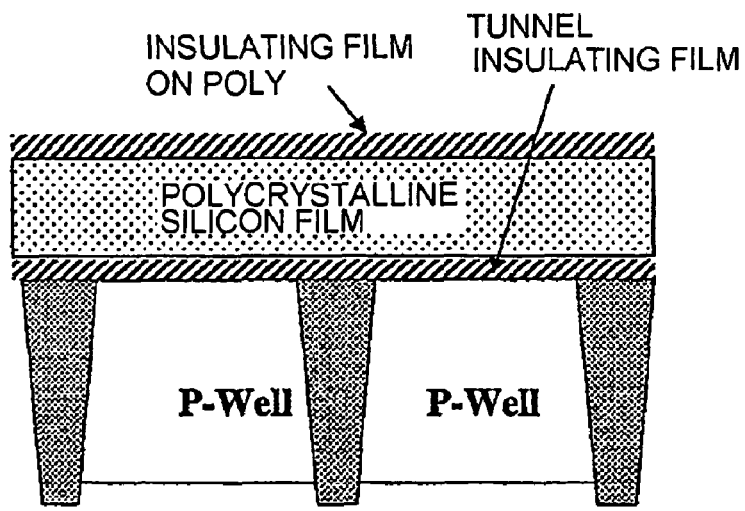

[FIG. 10]
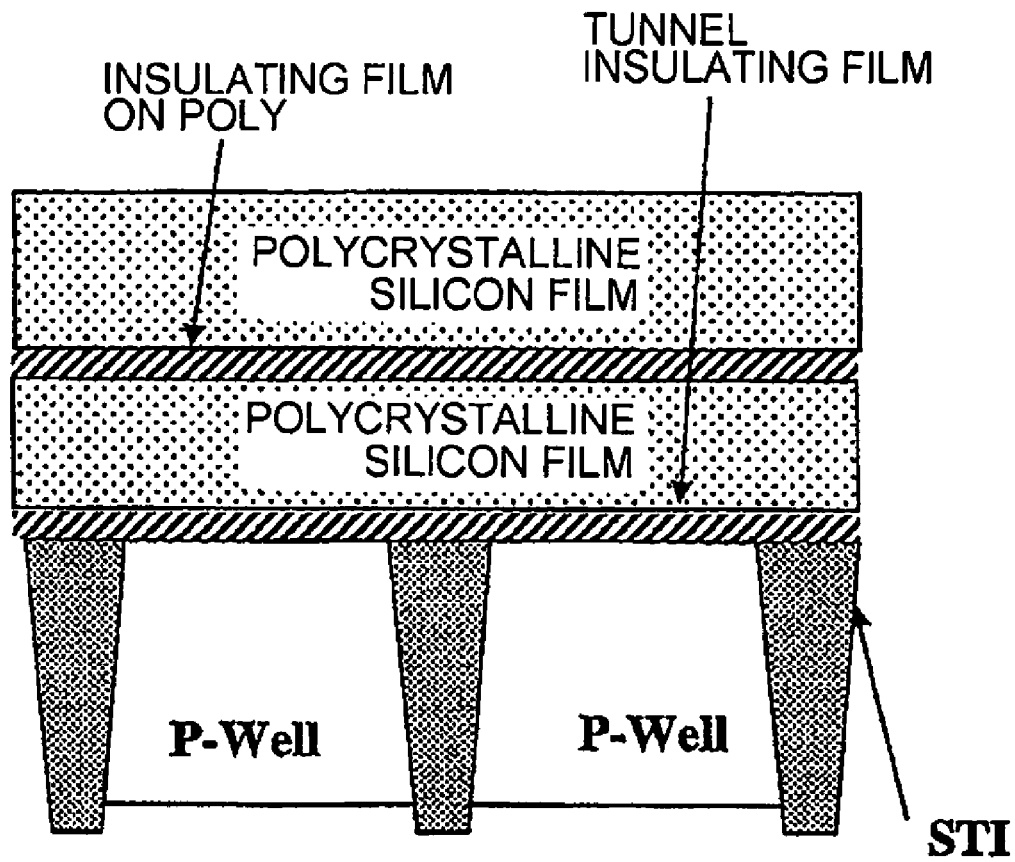
[FIG. 11]
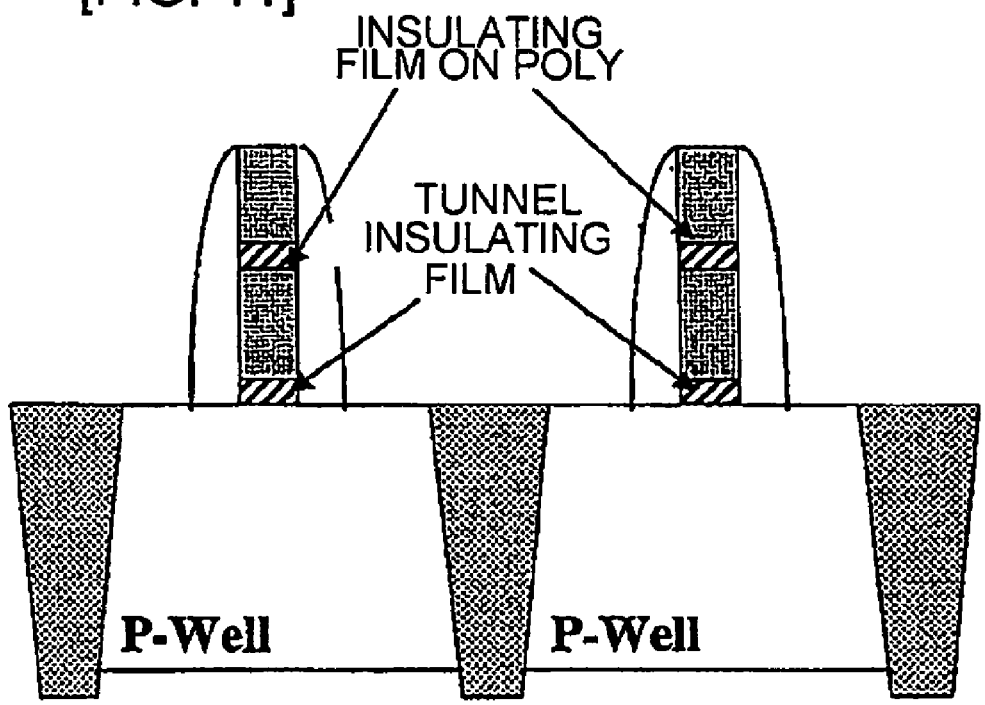

[FIG. 12]
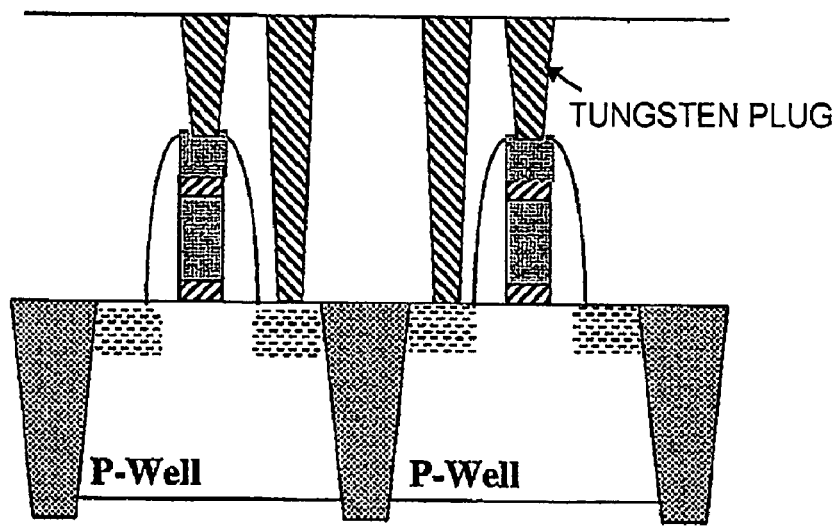
[FIG. 13]
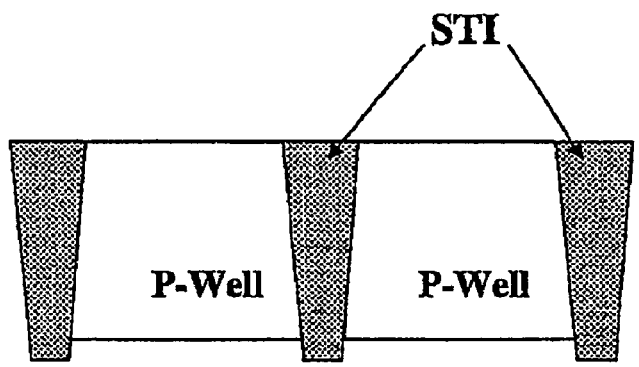
[FIG. 14]
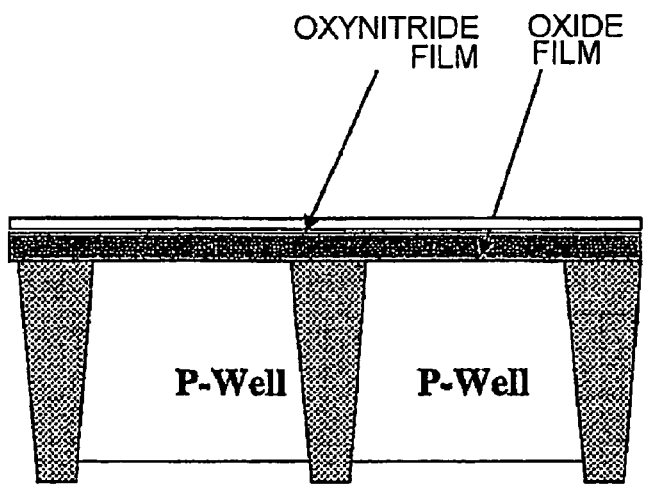

[FIG. 15]
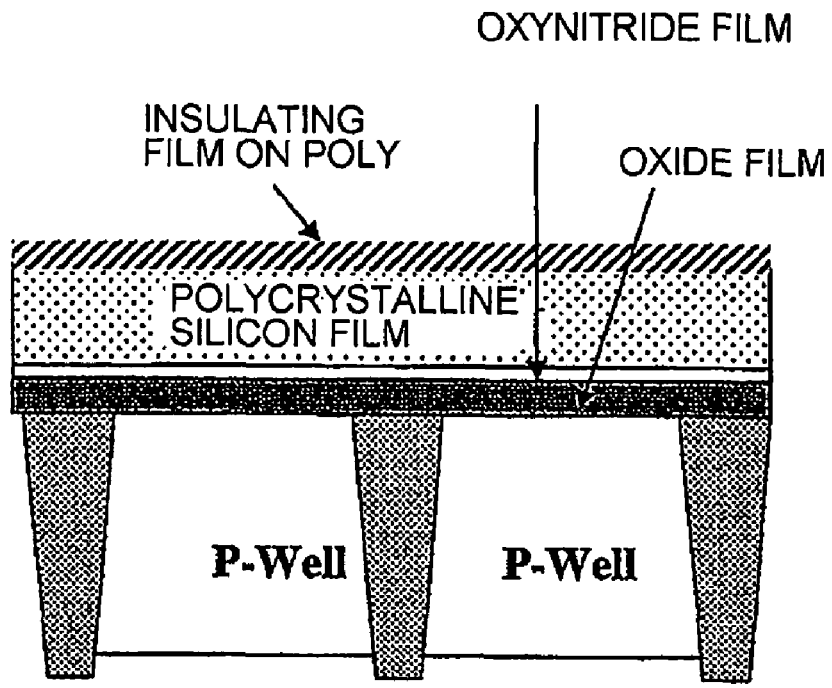
[FIG. 16]
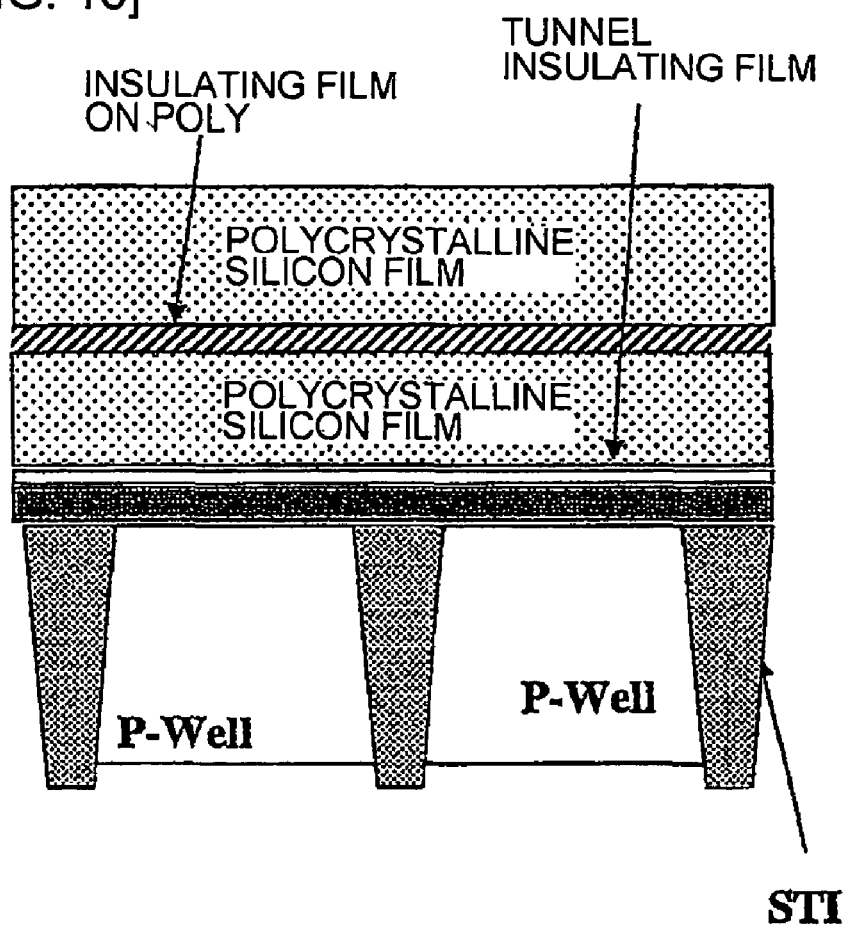

[FIG. 17]
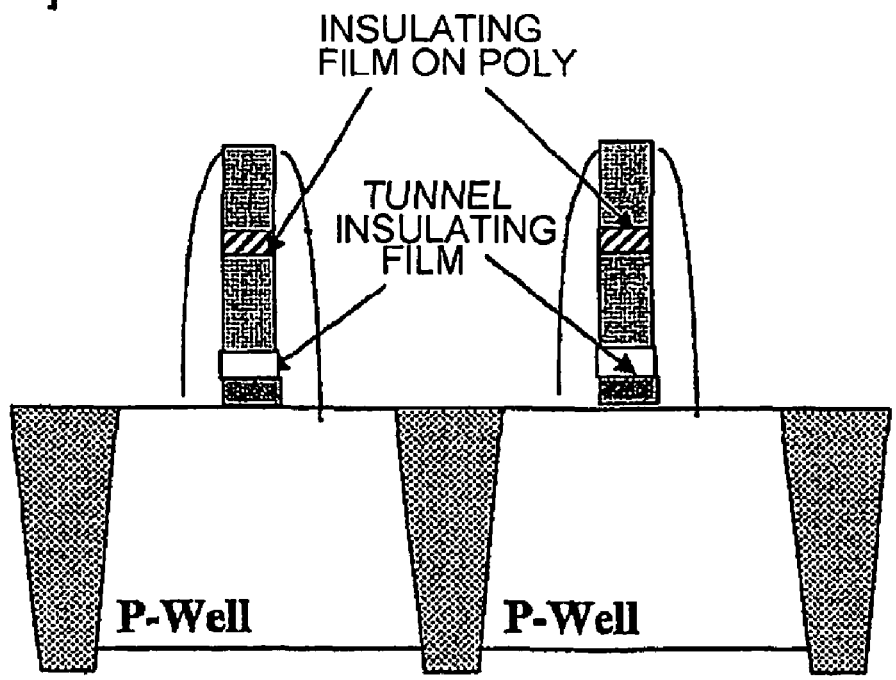
[FIG. 18]
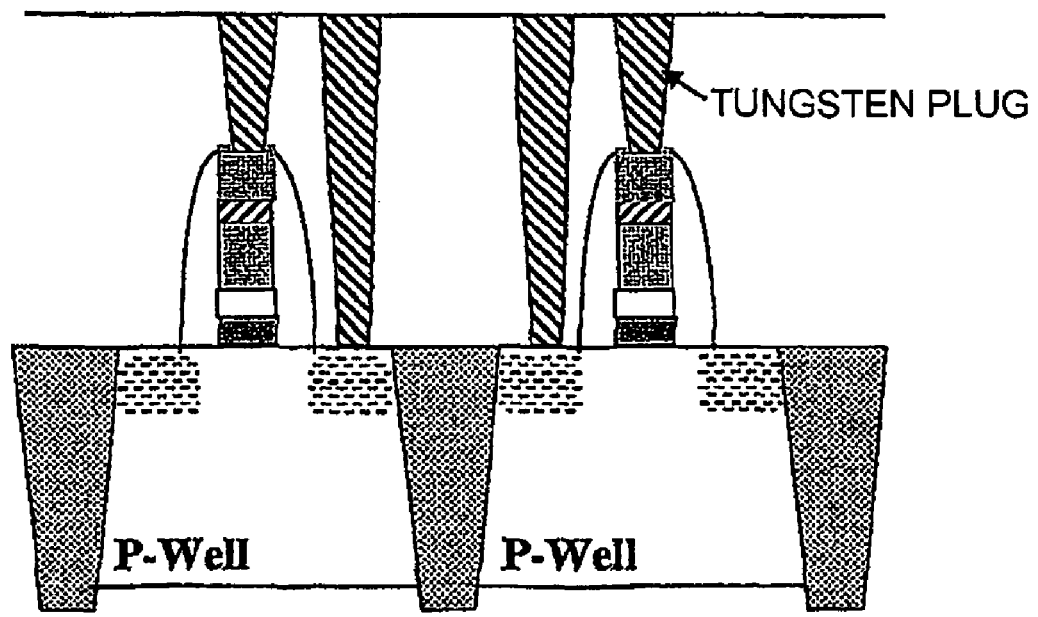

PLASMA PROCESSING METHOD AND METHOD FOR MANUFACTURING AN ELECTRONIC DEVICE

TECHNICAL FIELD

This invention relates to a plasma processing method in which an object to be processed, such as a semiconductor substrate, and a substrate for a liquid crystal display or the like, is subjected to processing such as oxidation, nitridation, oxynitridation or the like and to a manufacturing method for manufacturing an electronic device such as a semiconductor device by the use of such a plasma processing method.

BACKGROUND ART

As a conventional plasma processing apparatus, use has been made of an apparatus as described in Patent Document 1. As described in Patent Document 1, this plasma processing apparatus comprises a radial line slot antenna adapted to radiate a microwave into a process chamber, a phase delay plate adapted to compress the wavelength of the microwave radiated from the antenna, a cover plate disposed at an interval from the phase delay plate, and a dielectric member disposed immediately below the cover plate. Further, a construction having a number of gas outlets is disposed under the dielectric member at an interval therefrom.

A gas for plasma generation is supplied into a vacuum container. When the microwave is applied from the antenna in this state, a high-density plasma is generated in a space between the dielectric member and the construction. This plasma is introduced through the construction into a process space where a semiconductor wafer is processed. With such a configuration, a process gas ejected from the gas outlets of the construction is excited by the high-density plasma formed under the dielectric member.

In this case, a flange constituting the process container is formed with a plasma gas supply passage communicating with a plasma gas inlet provided in an outer wall of the process chamber. From the plasma gas inlet, the plasma excitation gas such as Ar or Kr is fed to the supply passage in the flange. Further, the excitation gas is introduced into the process chamber through the supply passage and a gas outlet of the flange.

In the foregoing plasma processing apparatus having the radial line slot antenna, the uniform high-density plasma is formed in the space immediately below the dielectric member.

Patent Document 1:
Japanese Unexamined Patent Application Publication (JP-A) No. 2001-500327

DISCLOSURE OF THE INVENTION

Problem to be Solved by the Invention

Conventionally, an oxynitriding process of a substrate is carried out at a high temperature of 600° C. to 800° C. and there is known a problem that dopants are rediffused due to this high temperature process.

Therefore, as known from Japanese Unexamined Patent Application Publication No. 2000-294550, there is cited a plasma oxynitriding process that accelerates oxynitriding by a plasma at low temperature so as to prevent the rediffusion. However, there is known a problem that, simultaneously, an object to be processed is damaged due to the plasma process.

According to experiments by the present inventors, a problem has been found that leakage current increases on the low electric field side by introduction of an oxynitriding process gas into the inside in a plasma oxynitriding process.

An object of this invention is to provide a technique for clearing up the cause of various faults inherent to the foregoing oxynitriding process and enabling to reduce those faults.

A specific object of this invention is to provide a plasma process that can realize high-quality oxynitriding.

As a result of examining the cause of the foregoing faults, the present inventors have found a problem that excessive dissociation is accelerated by introduction of nitrous oxide into the inside of a plasma so that $N_2$ ions are produced to damage a formed oxynitride film.

In view of this, this invention proposes a manufacturing method using a plasma processing apparatus capable of reducing the production of ions that damage an insulating film and of uniformly and efficiently supplying oxynitriding species in the plane of a process substrate.

Means for Solving the Problem

According to one mode of this invention, when nitrous oxide is used as an oxynitriding process gas, the electron temperature in a plasma is approximately 3.0 eV in a conventional plasma process. On the other hand, the binding energy between a nitrogen molecule and an oxygen atom is approximately 2.24 eV in nitrous oxide.

Therefore, if nitrous oxide is introduced into a plasma whose electron temperature is equal to or less than this nitrous oxide binding energy, it is possible to reduce the excessive dissociation.

Further, even in the case of another oxynitriding process gas such as ammonia, not limited to nitrous oxide, it is possible to reduce the production of $N_2$ ions by suppressing excessive dissociation, thereby improving the properties of an oxynitride film.

According to an aspect of this invention, there is provided a plasma processing method in which plasma is generated by the use of a plasma excitation gas and process gas is introduced into the plasma to thereby process an object to be processed, the plasma processing method being characterized in that the process gas includes nitrous oxide gas and the nitrous oxide gas is introduced into the plasma whose electron temperature is less than 2.24 eV.

In the plasma processing method, processing using the nitrous oxide gas introduced into the plasma, whose electron temperature is less than 2.24 eV, can be carried out by introducing the plasma excitation gas into a process chamber from an upper shower plate, generating the plasma under the upper shower plate, causing the plasma to pass through a lower shower plate provided under the upper shower plate so as to reach the object to be processed, and introducing the nitrous oxide gas from the lower shower plate into the plasma under the lower shower plate.

According to this invention, there is provide a method for manufacturing an electronic device, characterized by comprising a step of carrying out an oxynitriding process to the object to be processed by the use of the plasma processing method.

Further, there is obtained a manufacturing method for manufacturing a semiconductor device product, a liquid crystal display device produce, or an organic EL display device product, which is characterized by carrying out a plasma process by the use of the foregoing plasma processing method.

Effect of the Invention

As described above, according to this invention, it becomes possible to suppress the production of ions, which damage an oxynitride film, by suppressing dissociation. Further, it also becomes possible to efficiently produce oxynitriding species.

This invention is particularly effective for oxynitriding that uses nitrous oxide, so that it becomes possible to form a high-quality oxynitride film. However, this invention is not limited to this nitrous oxide, but enables formation of a high-quality oxynitride film by suppressing dissociation even in another oxynitriding process using ammonia or the like.

It is known that, in this invention, leakage current can be reduced by forming a high-quality oxynitride film, which is quite effective in improving the storage properties of a memory or the like.

BRIEF DESCRIPTION OF THE DRAWINGS

[FIG. 1] is a sectional view of a plasma processing apparatus in an embodiment of this invention.

[FIG. 2] shows the measurement results of radicals in the embodiment of this invention.

[FIG. 3] shows a spectrum in the embodiment of this invention.

[FIG. 4] shows a spectrum in the embodiment of this invention.

[FIG. 5] shows the leakage current measurement results in the embodiment of this invention.

[FIG. 6] shows the measurement results of radicals in the embodiment of this invention.

[FIG. 7] is a device sectional view in Example 1 of this invention.

[FIG. 8] is a device sectional view in Example 1 of this invention.

[FIG. 9] is a device sectional view in Example 1 of this invention.

[FIG. 10] is a device sectional view in Example 1 of this invention.

[FIG. 11] is a device sectional view in Example 1 of this invention.

[FIG. 12] is a device sectional view in Example 1 of this invention.

[FIG. 13] is a device sectional view in Example 2 of this invention.

[FIG. 14] is a device sectional view in Example 2 of this invention.

[FIG. 15] is a device sectional view in Example 2 of this invention.

[FIG. 16] is a device sectional view in Example 2 of this invention.

[FIG. 17] is a device sectional view in Example 2 of this invention.

[FIG. 18] is a device sectional view in Example 2 of this invention.

DESCRIPTION OF SYMBOLS

101: vacuum container
102: dielectric member
103: plasma excitation gas inlet
104: plasma excitation gas introduction passage
105: plasma excitation gas outlet
106, 107, 108: O-ring
109: radial line slot antenna
110: lattice-shaped shower plate
111: process gas inlet
112: process gas outlet
113: stage
114: exhaust port
115: substrate
116: coaxial waveguide
117: process chamber
118: process gas passage
119: slit
120: wave delay plate
121: plate

BEST MODE FOR CARRYING OUT THE INVENTION

FIG. 1 is a side sectional view of a plasma processing apparatus according to an embodiment of this invention. The plasma processing apparatus according to the embodiment comprises a vacuum container 101, a dielectric member 102, a plasma excitation gas inlet 103, a plasma excitation gas introduction passage 104, a plasma excitation gas outlet 105, O-rings 106, 107, and 108, a radial line slot antenna 109, a lattice-shaped shower plate 110, a process gas inlet 111, process gas outlets 112, a stage 113, and exhaust ports 114. A substrate 115 to be subjected to plasma processing is placed on the stage 113. The stage 113 has a heating mechanism for raising the substrate temperature.

On a surface of the dielectric member 102 on the side opposite to the vacuum container 101, there is provided a radial line slot antenna 109 adapted to radiate a microwave for plasma excitation. The radial line slot antenna 109 is configured such that a wave delay plate 120 made of alumina is sandwiched between a copper plate having a thickness of 0.3 mm and formed with a number of slits 119 and an aluminum plate 121 and, further, a coaxial waveguide 116 for supplying the microwave is disposed at the center. The microwave of 2.45 GHz generated by a microwave power supply (not shown) is supplied to the coaxial waveguide 116 through an isolator and a matching device (not shown either) and then proceeds from the center toward the periphery in the wave delay plate 120 so as to be substantially uniformly radiated to the side of the dielectric member 102 through the slits 119. The radiated microwave is introduced into a process chamber 117 through the dielectric member 102 and ionizes a plasma excitation gas, thereby generating a high-density plasma.

In this embodiment, the vacuum container 101 is formed of aluminum and the dielectric member 102 is formed of aluminum nitride. The frequency of the plasma excitation microwave is 2.45 GHz. The substrate 115 is a silicon substrate having a diameter of 200 mm. The microwave radiated from the radial line slot antenna 109 disposed in the atmosphere ionizes the gas introduced into the vacuum container 101 through the plasma excitation gas outlet 105, thereby generating a plasma.

This apparatus is configured such that the plasma excitation gas and a process gas can be ejected from different introduction ports. The plasma excitation gas is ejected into the vacuum container 101 through the plasma excitation gas outlet 105. On the other hand, the process gas is supplied from the process gas inlet 111 and passes through the inside of the lattice-shaped shower plate 110 so as to be ejected to the side of the substrate 115 through the plurality of process gas outlets 112.

In the illustrated plasma processing apparatus, the lattice-shaped shower plate 110 is disposed between the dielectric member 102 and the process substrate 115 in the process chamber 101. This lattice-shaped shower plate 110 is formed with many process gas outlets 112 for supplying the process gas from an external process gas source through a process gas passage 118 formed in the process chamber. The process gas outlets 112 of the lattice-shaped shower plate 110 each eject the supplied process gas into a space between the lattice-shaped shower plate 110 and the process substrate 115. The lattice-shaped shower plate 110 is formed, between the adjacent process gas outlets 112, with opening portions each having a size to efficiently pass by diffusion the plasma formed in the space 117.

In the structure as described above, when the plasma excitation gas is ejected into the vacuum container 101 from the plasma excitation gas outlet 105, the ejected plasma excitation gas is excited by the high-density plasma formed in the space. However, since the plasma excitation gas from the plasma excitation gas outlet 105 flows toward the space between the lattice-shaped shower plate 110 and the process substrate 115 from the space between the plasma excitation gas outlet 105 and the lattice-shaped shower plate 110, components of the process gas that return to the space between the plasma excitation gas outlet 105 and the lattice-shaped shower plate 110 are small in amount, so that decomposition of gas molecules due to excessive dissociation caused by exposure to the high-density plasma is small in amount, thereby enabling high-quality substrate processing.

By the use of the plasma processing apparatus of FIG. 1, an experiment was conducted in which a silicon substrate was oxynitrided. Kr gas and $O_2$ gas for plasma excitation were introduced into the vacuum container from the plasma excitation gas outlet 105, nitrous oxide gas was introduced into the vacuum container 101 from the lattice-shaped shower plate 110, and a plasma was produced with an output of 2.0 kW and at a frequency of 2.45 GHz. The pressure inside the vacuum container 101 was set to approximately 5 Pa (0.04 Torr) and the flow rates were each set to 100 cc. FIG. 2 shows the measurement results of NO radicals and $N_2O$ radicals in the plasma state in this process. In a conventional structure, the production of NO radicals or $N_2O$ radicals that contribute to oxynitriding was hardly detected. This is caused by the fact that the nitrous oxide gas was excessively dissociated in the plasma, i.e. due to the excitation of the plasma, to produce $N_2$ and $O_2$. As shown in FIG. 3, it has also been made clear in the actual plasma optical emission measurement that much of the nitrous oxide gas is dissociated into $N_2$ and $O_2$.

On the other hand, in this invention, by introducing the nitrous oxide from the lattice-shaped shower plate 110, it is possible to observe $N_2O$ radicals and NO radicals that serve as oxynitriding species. This is because, as different from the conventional structure, since the space between the lattice-shaped shower plate 110 and the process substrate 115 served as a plasma diffusion region, the electron temperature was very low so that excessive dissociation was suppressed.

Herein, it has been ascertained according to the measurement that when a plasma is generated in the vacuum container according to the prior art, the electron temperature between the dielectric member and the process substrate is approximately 3.0 eV. On the other hand, it has also been ascertained that when a plasma is generated by the use of the lattice-shaped shower plate that ejects the process gas, the electron temperature in the space between the lattice-shaped shower plate and the process substrate is approximately 1.0 eV. Since the binding energy between a nitrogen molecule and an oxygen atom is approximately 2.24 eV in nitrous oxide, it is possible to suppress excessive dissociation by introducing the process gas through the process gas outlets of the lattice-shaped shower plate.

Following it, the production of $N_2$ and $O_2$ caused by excessive dissociation of the nitrous oxide gas is suppressed and, hence, NO radicals and $N_2O$ radicals that contribute to oxynitriding can be efficiently produced. As shown in FIG. 4, it is understood by the use of a Fourier transform infrared spectrophotometer that, with respect to introduction of the nitrous oxide gas at 100 cc, approximately 99% is dissociated in the prior art, while, in this invention, the dissociation ratio is 96%, and therefore, there is a difference of approximately four times with respect to the non-dissociated nitrous oxide gas present in the plasma. This shows the state where the dissociation is suppressed so that NO radicals and $N_2O$ radicals are easily produced.

Next, as shown in FIG. 5, a substrate was subjected to an oxynitriding process by the use of the plasma processing apparatus of FIG. 1 and the electrical properties thereof were measured. It has been found that, in this invention, the leakage current density of an oxynitride film is low in an electric field of particularly 6.5 MV/cm$^2$ or less. This is because $N_2$ ions are produced due to the production of $N_2$ in the processing of a substrate according to the prior art and these ions reach the substrate in the processing, thereby causing deterioration of the film quality.

However, since the production of $N_2$ due to excessive dissociation is suppressed by processing the substrate according to this invention, the production of $N_2$ ions can also be suppressed following it, so that it becomes possible to reduce deterioration of the substrate during the processing.

On the other hand, by the use of an apparatus having the same structure as described above, the same experiment was conducted for nitrogen monoxide. As shown in FIG. 6, the measurement was carried out for NO radicals and $N_2O$ radicals in a plasma under the same conditions for nitrous oxide.

It has been found that also in the case of nitrogen monoxide, both are reduced as compared with the prior art by introducing the gas from the lattice-shaped shower plate. Since the binding energy between an oxygen molecule and a nitrogen molecule is 6.46 eV in nitrogen monoxide, it is understood that excessive dissociation is not produced in the plasma even in the prior art. However, by changing the introduction port of oxygen gas to the lattice-shaped shower plate, the production of $N_2O$ radicals can be suppressed and substantially only NO radicals can be selectively produced. This is known to be effective in forming a homogeneous oxynitride film because the NO radical has an equal number of oxygen and nitrogen atoms.

The reduction in leakage current value in the low electric field region as described above is very effective in improving the storage properties of a memory or the like.

EXAMPLE 1

FIGS. 7 to 12 are process sectional views for explaining a manufacturing method of cell transistors in a flash memory device.

FIG. 7 is a sectional view of a P-type Si substrate element-isolated by STI. A tunnel insulating film having a thickness of, for example, 7 nm is formed by the oxynitride film forming method being this invention. In this event, for example, Kr/$O_2$ mixed gases are introduced at 1000 sccm/30 sccm, respectively, into the plasma excitation region (electron temperature: approximately 7 eV) in the chamber and $N_2O$, NO, or $NH_3$ gas is introduced into the plasma diffusion region (electron temperature: approximately 1.0 eV) by the use of the lattice-shaped shower plate, thereby forming the insulating film while generating a microwave-excited plasma in the state where the pressure inside the chamber is set to 133 Pa (1 torr). The insulating film formed by this invention has a feature in that nitrogen is localized in the insulating film/silicon interface and the surface of the insulating film and this nitrogen is effective in suppressing deterioration of the insulating film caused by tunneling of charge in the insulating film. Thereafter, a polycrystalline silicon film of 90 nm is formed over the entire surface of the substrate by the use of a CVD method. Further, an insulating film is formed on the polycrystalline silicon film by the oxynitride film forming method being this invention. In this event, the insulating film is formed by the use of the oxynitriding method as described above. In this invention, since the insulating film can be formed in a low temperature process at 400° C. or less, the insulating film can be formed without changing the surface state of the polycrystalline silicon film. Thereafter, a second-layer polycrystalline silicon film of 150 nm is formed by the CVD method.

Then, an interlayer insulating film is formed over the entire surface of the substrate and contact holes connected to source/drain regions are formed, and thereafter, these contact holes are filled with, for example, tungsten (FIG. 12). Then, after forming a wiring layer connected to these tungsten plugs, a surface protective film is formed over the entire surface of the substrate.

EXAMPLE 2

FIGS. 13 to 18 are process sectional views for explaining a manufacturing method of cell transistors in a flash memory device.

FIG. 13 is a sectional view of a P-type Si substrate element-isolated by STI. A tunnel insulating film having a thickness of, for example, 7 nm is formed in two stages. In this two-stage forming method, an oxide film of 6.5 nm is first formed by a thermal oxidation method at, for example, 900° C. or by a microwave-excited plasma of, for example, $Kr/O_2$ mixed gases and, thereafter, an oxynitride film of 0.5 nm is formed by the oxynitride film forming method of this invention.

The formation of the oxynitride film being this invention is carried out such that, for example, $Kr/O_2$ mixed gases are introduced at 1000 sccm/30 sccm, respectively, into the plasma excitation region (electron temperature: approximately 3 eV) in the chamber and $N_2O$, NO, or NO gas is introduced into the plasma diffusion region (electron temperature: approximately 1.0 eV) by the use of the lattice-shaped shower plate, thereby forming the insulating film while generating a microwave-excited plasma in the state where the pressure inside the chamber is set to 133 Pa (1 torr).

The insulating film formed in the two stages as described above has a feature in that the nitrogen concentration in the insulating film/silicon interface and the surface of the insulating film can be optionally controlled according to the formation conditions of the oxynitride film. By carrying out the oxynitriding being this invention after the formation of the thermal oxide film or the plasma oxide film being the conventional technique, it becomes possible to incorporate nitrogen into the interface at low temperature and without damaging the insulating film.

This nitrogen in the insulating film interface is effective in suppressing deterioration of the insulating film caused by tunneling of charge in the insulating film. Thereafter, a polycrystalline silicon film of 90 nm is formed over the entire surface of the substrate by the use of the CVD method. Further, an insulating film is formed on the polycrystalline silicon film by the foregoing oxynitride film forming method being this invention. In this invention, since the insulating film can be formed in a low temperature process at 400° C. or less, the insulating film can be formed without changing the surface state of the polycrystalline silicon film.

Then, an interlayer insulating film is formed over the entire surface of the substrate and contact holes connected to source/drain regions are formed, and thereafter, these contact holes are filled with, for example, tungsten (FIG. 18). Then, after forming a wiring layer connected to these tungsten plugs, a surface protective film is formed over the entire surface of the substrate.

As described above, in the embodiment of this application, by the use of the plasma processing method of this invention, there is obtained the electronic device manufacturing method that can uniformly and efficiently form the oxynitride film.

The invention claimed is:

1. A plasma processing method in which plasma is generated by the use of a plasma excitation gas and process gas is introduced into said plasma to thereby process an object to be processed, the method comprising:
   introducing said plasma excitation gas into a process chamber from an upper shower plate;
   generating said plasma under said upper shower plate;
   causing said plasma to pass through a lower shower plate provided under said upper shower plate so as to reach said object to be processed; and
   introducing said nitrous oxide gas, as said process gas, from said lower shower plate into the plasma whose electron temperature is less than binding energy 2.24 eV between a nitrogen molecule and an oxygen atom in said nitrous oxide, said nitrous oxide gas being introduced into the plasma under said lower shower plate,
   wherein said nitrous oxide gas is provided to said lower shower plate from a gas discharge tube provided at only one end of said lower shower plate, to thereby be discharged through respective openings of said lower shower plate into the process chamber.

2. A method for manufacturing an electronic device, further comprising a step of carrying out an oxynitriding process to said object to be processed by the use of the plasma processing method according to claim 1.

3. The plasma processing method according to claim 1, wherein the respective openings of said lower shower plate are square-shaped openings.

4. The plasma processing method according to claim 1, further comprising:
   providing microwave radiation into a top portion of the process chamber by way of a radial line slot antenna.

* * * * *